United States Patent
Liu

(10) Patent No.: US 8,476,720 B2
(45) Date of Patent: Jul. 2, 2013

(54) SYSTEMS AND METHODS FOR VERTICALLY STACKING A SENSOR ON AN INTEGRATED CIRCUIT CHIP

(75) Inventor: Chia-Ming Liu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/172,604

(22) Filed: Jun. 29, 2011

(65) Prior Publication Data

US 2013/0001709 A1   Jan. 3, 2013

(51) Int. Cl.
*H01L 29/84* (2006.01)

(52) U.S. Cl.
USPC .... 257/415; 257/656; 257/737; 257/E21.506; 257/E29.324; 438/48; 438/118; 438/121

(58) Field of Classification Search
USPC .................. 257/415, 777, E21.001, E29.324
See application file for complete search history.

(56) References Cited

U.S. PATENT DOCUMENTS

| | | | |
|---|---|---|---|
| 6,956,283 B1 * | 10/2005 | Peterson | 257/680 |
| 2003/0124599 A1 | 7/2003 | Chen et al. | |
| 2005/0258528 A1 * | 11/2005 | Jensen et al. | 257/686 |
| 2007/0138605 A1 * | 6/2007 | Nam et al. | 257/666 |
| 2007/0290364 A1 * | 12/2007 | Gupta et al. | 257/777 |
| 2008/0146082 A1 | 6/2008 | Lin et al. | |
| 2009/0051447 A1 | 2/2009 | McCracken et al. | |
| 2009/0207574 A1 | 8/2009 | Chen et al. | |
| 2009/0282917 A1 * | 11/2009 | Acar | 73/514.02 |
| 2010/0276800 A1 * | 11/2010 | Yanase et al. | 257/737 |

* cited by examiner

*Primary Examiner* — Minh-Loan T Tran
*Assistant Examiner* — Fazli Erdem
(74) *Attorney, Agent, or Firm* — Lowe Graham Jones PLLC

(57) ABSTRACT

A sensing unit package with reduced size and improved thermal sensing capabilities. An exemplary package includes a printed circuit board with a plurality of electrical traces, an application-specific integrated circuit (Analog ASIC) chip, and a micromachined sensor formed on a microelectromechanical system (MEMS) die. The Analog ASIC chip is electrically and mechanically attached to the printed circuit board. The MEMS die is in direct electrical communication with only a portion of the electrical traces of the printed circuit board and is mechanically and thermally attached directly to the Analog ASIC chip. A thermally conducting compound is located between the MEMS die and the Analog ASIC chip. One or more solder balls electrically attach the Analog ASIC chip to the printed circuit board and one or more solder traces electrically attach the MEMS die to the printed circuit board.

7 Claims, 2 Drawing Sheets

SYSTEMS AND METHODS FOR VERTICALLY STACKING A SENSOR ON AN INTEGRATED CIRCUIT CHIP

BACKGROUND OF THE INVENTION

Previous approaches have placed the application-specific integrated circuit (Analog ASIC) chip on the opposite side of a printed circuit board (PCB) from where a microelectromechanical system (MEMS) sensor, such as an accelerometer or gyroscope, is located. The Analog ASIC chip includes a temperature sensor designed to sense the temperature of the MEMS sensor, but the sensed temperature value is greatly dissipated with this approach because the heat produced by the MEMS sensor must be conducted through the PCB. Thus, the accuracy of sensed MEM sensor temperature is greatly reduced.

U.S. Patent Application Publication No. 2009/0282917 to Acar provides an integrated micromachined inertial sensing unit with multi-access angular rate and acceleration sensors. Acar discloses placing one or more sensors on top of an ASIC chip, as shown in FIGS. 1-3. However, Acar is unconcerned with providing adequate thermal conduction between the sensor and the ASIC chip. Acar shows that the sensors are electrically attached to the ASIC chip through metal vias. The ASIC chip includes electrical traces and signal condition circuitry for receiving and amplifying/processing signals produced by the sensor. Because there appears to be a physical gap between the sensor and the ASIC chip, the thermal conduction capabilities between the sensor and the ASIC chip would be possibly worse than the design in which the sensor is located on one side of a PCB and the ASIC chip is located on the opposite side of the PCB.

SUMMARY OF THE INVENTION

The present invention provides a sensing unit package with reduced size and improved thermal sensing capabilities. An exemplary package includes a printed circuit board with a plurality of electrical traces, an analog application-specific integrated circuit (Analog ASIC) chip, and a micromachined sensor formed on a microelectromechanical system (MEMS) die. The Analog ASIC chip is electrically and mechanically attached to the printed circuit board. The MEMS die is in direct electrical communication with only a portion of the electrical traces of the printed circuit board and is mechanically and thermally attached directly to the Analog ASIC chip.

In one aspect of the invention, the sensor includes at least one of an accelerometer or an angular rate sensor.

In another aspect of the invention, the MEMS die is a leadless chip carrier package or a wafer-level chip-scale package (WLCSP).

In still another aspect of the invention, a thermally conducting compound/epoxy is located between the MEMS die and the Analog ASIC chip.

In yet another aspect of the invention, one or more solder balls electrically attach the Analog ASIC chip to the printed circuit board and one or more solder traces electrically attach the MEMS die to the printed circuit board.

BRIEF DESCRIPTION OF THE DRAWINGS

Preferred and alternative embodiments of the present invention are described in detail below with reference to the following drawings:

FIG. 1-2 illustrates a perspective view of the sensor package shown in FIG. 1;

FIG. 2 illustrates a schematic block diagram of an Analog ASIC chip used in the package shown in FIG. 1.

DETAILED DESCRIPTION OF THE INVENTION

Figure 1:
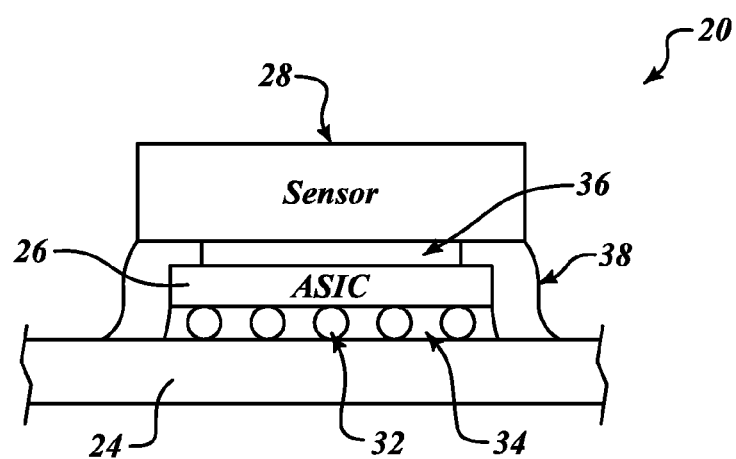
FIG. 1-1 illustrates a side cross-sectional view of a sensor package formed in accordance with an embodiment of the present invention.
Figures 1, 2:
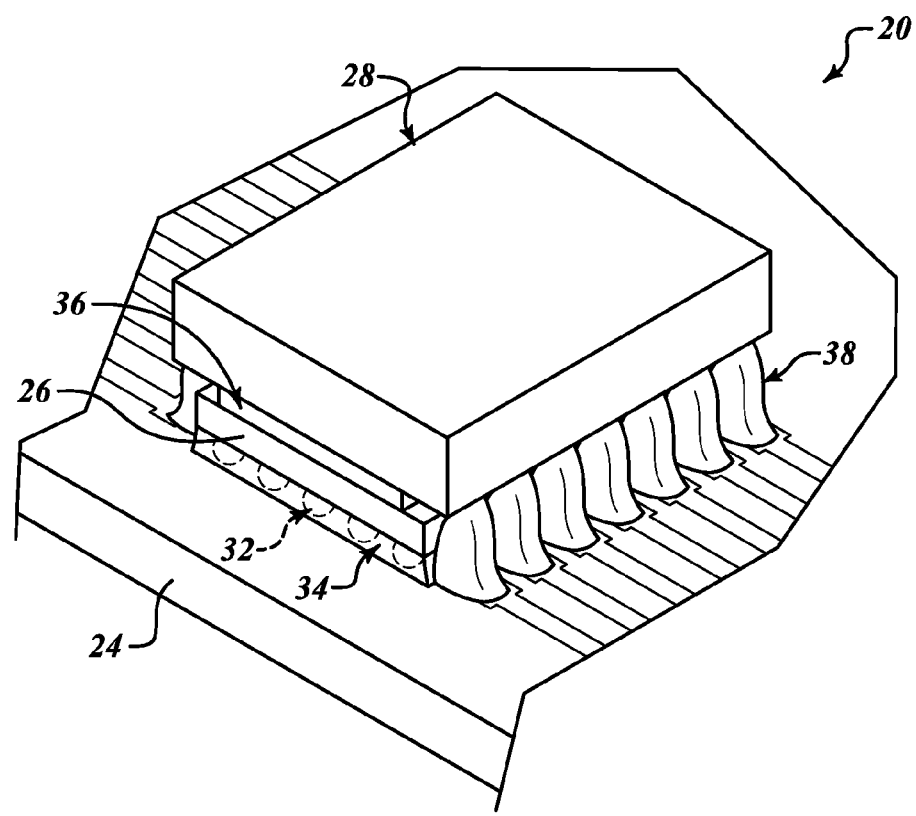
Figure 2:
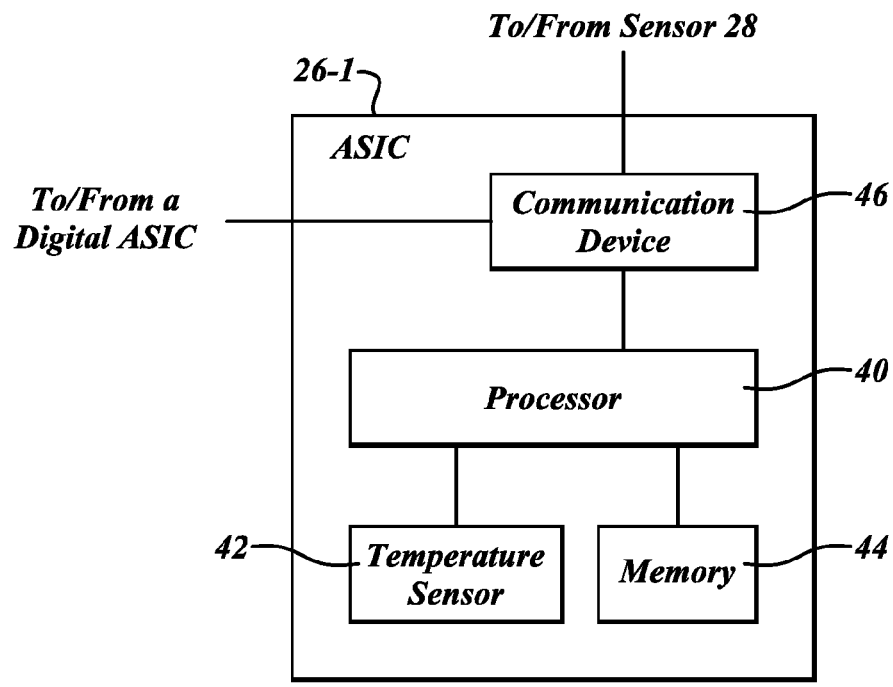

FIGS. 1-1 and 1-2 illustrate a package 20 formed in accordance with an embodiment of the present invention. The package 20 includes a sensor 28 that is mounted to an analog application-specific integrated circuit (Analog ASIC) chip 26 that is mounted to a printed circuit board (PCB) 24.

The Analog ASIC chip 26 is electrically attached to the PCB 24 using one or more solder balls 32. The PCB 24 includes a circuit previously patterned for receiving the solder balls, thereby creating an electrical connection between components within the Analog ASIC chip 26 and circuitry on the PCB 24.

In one embodiment, a nonelectrically conductive epoxy 34 is injected with syringe on the corner between the Analog ASIC chip 26 and the PCB 24. The area under the Analog ASIC chip 26 is filled through the capillary action. After the Analog ASIC chip 26 is attached to the PCB 24, a thermally conductive, low coefficient of thermal expansion (CTE) epoxy 36, such as Master Bond EP30LTE-LO or thermal compound, is applied on the topside of the Analog ASIC chip 26. The sensor 28 is then placed on top of the Analog ASIC chip 26 and secured in place with a metal clip with nonabrasive tips during the epoxy cure stage. The sensor 28 may have been previously packaged a number of different ways, such as by leadless chip carrier (LCC) packaging or wafer-level chip-scale packaging (WLCSP).

The sensor 28 is then electrically connected to electrical pads or traces located on the surface of the PCB 24. In one embodiment, one or more solder leads 38 are used to electrically connect the sensor 28 to the PCB 24. In one embodiment, wire bonds may be used for electrically connecting the sensor 28 to the PCB 24.

FIG. 2 shows a block diagram of the Analog ASIC chip 26 shown in FIG. 1. The Analog ASIC chip 26 includes a processor 40, a temperature sensor 42, a memory device 44, and a communication device 46. The processor 40 is in signal communication with the temperature sensor 42, the memory 44, and the communication device 46. The communication device 46 receives signals to and from the attached sensor 28 and a Digital ASIC (not shown) via the circuit traces on the PCB 24, the solder leads 38, and the solder balls 32. The temperature sensor 42 senses temperature of the sensor 28 via the thermally conductive compound/epoxy 36.

Figure 3:
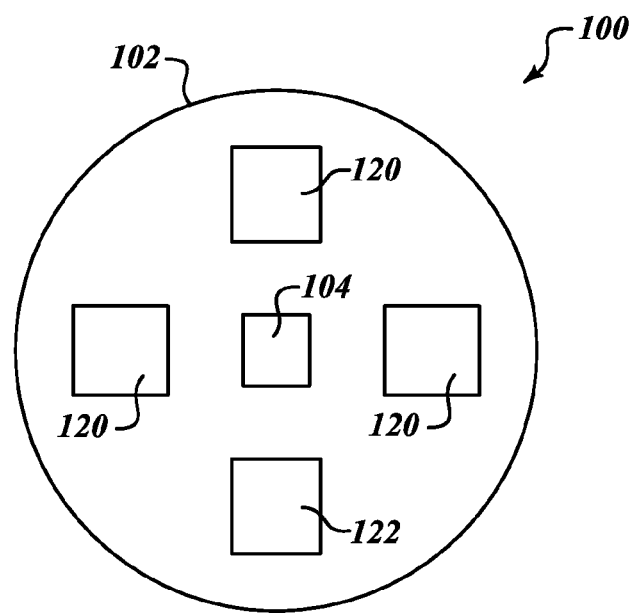
FIG. 3 illustrates a top schematic view of a three-axis accelerometer or gyroscope formed in accordance with an embodiment of the present invention.

FIG. 3 shows a top view of a sensor package 100. The sensor package 100 includes a PCB 102, three sensor/Analog ASIC chip packages 120 that are similar to that shown in FIG. 1, a Digital ASIC 122, and a connector device 104. The Digital ASIC 122 connects the sensor package 100 (i.e., all of the packages 120) via the circuit traces on the PCB 102. The connector device 104 allows the Digital ASIC 122 to electrically connect to an external component, such as micro board with Central Process Unit (CPU) for data process and management. The PCB 102 includes electrical traces between the sensor Analog ASIC chip packages 120, Digital ASIC 122, and the connector device 104.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A sensing unit comprising:
   a printed circuit board comprising a plurality of electrical traces;
   an application-specific integrated circuit (ASIC) chip being electrically and mechanically attached to the printed circuit board;
   a micromachined sensor formed on a microelectromechanical system (MEMS) die being in direct electrical communication with only a portion of the electrical traces of the printed circuit board and being mechanically and thermally attached directly to the ASIC chip;
   a nonelectrical epoxy connected to the ASIC chip and the printed circuit board;
   one or more solder balls, wherein the ASIC chip is electrically attached to the printed circuit board using the one or more solder balls, wherein the nonelectrical epoxy surrounds the solder balls; and
   one or more solder traces configured to electrically attach a lead on a surface of the MEMS die to the printed circuit board, wherein the surface of the MEMS die faces the ASIC chip and the printed circuit board.

2. The unit of claim 1, wherein the sensor comprises at least one of an accelerometer or an angular rate sensor.

3. The unit of claim 1, wherein the MEMS die is a leadless chip carrier (LCC) package.

4. The unit of claim 1, wherein the MEMS die is a wafer-level chip-scale package (WLCSP).

5. The unit of claim 1, further comprising a thermally conducting compound located between the MEMS die and the ASIC chip.

6. The unit of claim 5, wherein the thermally conducting compound is at least one of an adhesive compound or an epoxy.

7. A method comprising:
   electrically and mechanically attaching an application-specific integrated circuit (ASIC) chip directly to a printed circuit board using solder balls surrounded by non-conductive epoxy;
   only mechanically and thermally attaching a micromachined sensor formed on a microelectromechanical system (MEMS) die to the ASIC chip; and
   electrically attaching the sensor directly with only a portion of electrical traces located on the printed circuit board using one or more solder traces extending from a side of the MEMS die closest to the ASIC chip and the printed circuit board,
   wherein attaching the ASIC chip comprises injecting the non-conductive epoxy after the ASIC chip is attached to the printed circuit board.

* * * * *